United States Patent
Sumiyoshi

(10) Patent No.: US 12,355,401 B2
(45) Date of Patent: Jul. 8, 2025

(54) DOHERTY AMPLIFIER

(71) Applicant: Sumitomo Electric Industries, Ltd., Osaka (JP)

(72) Inventor: Takashi Sumiyoshi, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 537 days.

(21) Appl. No.: 17/732,687

(22) Filed: Apr. 29, 2022

(65) Prior Publication Data

US 2022/0368285 A1  Nov. 17, 2022

(30) Foreign Application Priority Data

May 12, 2021 (JP) .................. 2021-081075

(51) Int. Cl.
*H03F 1/02* (2006.01)
*H03F 3/21* (2006.01)
*H03F 1/56* (2006.01)

(52) U.S. Cl.
CPC ........... *H03F 1/0288* (2013.01); *H03F 3/211* (2013.01); *H03F 1/56* (2013.01); *H03F 2200/09* (2013.01); *H03F 2200/222* (2013.01); *H03F 2200/387* (2013.01)

(58) Field of Classification Search
CPC ......... H03F 1/0288; H03F 3/211; H03F 1/56; H03F 2200/09; H03F 2200/222; H03F 2200/387
USPC ............................................ 33/295; 330/295
See application file for complete search history.

(56) References Cited

U.S. PATENT DOCUMENTS 9,692,361 B2 * 6/2017 Blednov .............. H03F 1/0288
2014/0361834 A1 12/2014 Fritz et al.

FOREIGN PATENT DOCUMENTS

| CN | 106209010 A | * 12/2016 | |
| CN | 111988015 B | * 5/2024 | ............. H03H 11/28 |
| JP | 2014239425 A | 12/2014 | |
| WO | 2018109930 A1 | 6/2019 | |

OTHER PUBLICATIONS

Watanabe, S., et al., "A Broadband Doherty Power Amplifier Without a Quarter-Wave Impedance Inverting Network," IEICE Technical Report MW, 2012-82 (Oct. 2012) pp. 7-12, with English Translation.

* cited by examiner

*Primary Examiner* — Hafizur Rahman
(74) *Attorney, Agent, or Firm* — Volpe Koenig

(57) ABSTRACT

A Doherty amplifier includes a divider configured to divide an input signal into two signals, a first amplifier configured to amplify one of the two signals and output the amplified signal to a first node, a second amplifier configured to amplify the other of the two signals and output the amplified signal to a second node, a balun including lumped parameter elements and configured to output a signal obtained by combining the signal output from the first amplifier with the signal output from the second amplifier to a third node, and a path configured to DC-connect the first node to the second node, with the third node therebetween.

6 Claims, 9 Drawing Sheets

DOHERTY AMPLIFIER

CROSS REFERENCES TO RELATED APPLICATIONS

The present invention contains subject matter related to Japanese Patent Application No. 2021-081075 filed in the Japan Patent Office on May 12, 2021, the entire contents of which are incorporated herein by reference.

BACKGROUND OF THE INVENTION

1. Field of the Invention

The present invention relates to a Doherty amplifier.

2. Description of the Related Art

A Doherty amplifier is known as an amplifier that amplifies a radio frequency signal, such as a microwave. In the Doherty amplifier, input signals are amplified in parallel by a carrier amplifier and a peak amplifier, and the amplified signals are combined by a combiner. A lumped parameter balun is known to be used as the combiner (see, e.g., IEICE Technical Report MW 2012-82 (2012-10) pp. 7-12).

A Doherty amplifier of parallel connected load type has a large circuit, because it includes a quarter wavelength transmission line as a combiner. A Doherty amplifier of series connected load type has a compact size, because it includes a lumped parameter balun as a combiner. However, when a lumped parameter balun is used as a combiner, a capacitor is connected in series in a path between a carrier amplifier and a peak amplifier, with the balun therebetween. Since the capacitor functions as a direct current (DC) cut capacitor, a common bias voltage cannot be applied to the carrier amplifier and the peak amplifier.

SUMMARY OF THE INVENTION

The present disclosure has been made in view of the problem described above. An object of the present disclosure is to provide a Doherty amplifier that DC-connects a path between two amplifiers, with a balun therebetween.

First, embodiments of the present disclosure will be described by the following list.
(1) An embodiment of the present disclosure is a Doherty amplifier that includes a divider configured to divide an input signal into two signals, a first amplifier configured to amplify one of the two signals and output the amplified signal to a first node, a second amplifier configured to amplify the other of the two signals and output the amplified signal to a second node, a balun including lumped parameter elements and configured to output a signal obtained by combining the signal output from the first amplifier with the signal output from the second amplifier to a third node, and a path configured to DC-connect the first node to the second node, with the third node therebetween. A Doherty amplifier can thus be provided which has no capacitor in the path between the first amplifier and the second amplifier.
(2) The path preferably has only one fourth node for supplying a bias voltage to the first amplifier and the second amplifier.
(3) The balun preferably includes inductors connected in series in the path, and a capacitor shunt connected to the path.
(4) The balun preferably includes a first inductor connected at one end thereof to the first node and connected at the other end thereof to the third node, a capacitor shunt connected between the first node and the first inductor, a second inductor connected at one end thereof to the second node and connected at the other end thereof to a fifth node, a third inductor connected at one end thereof to the fifth node and connected at the other end thereof to the third node, a fourth inductor shunt connected between the second node and the second inductor, a fifth inductor shunt connected to the fifth node, and a sixth inductor shunt connected between the third inductor and the third node.
(5) Of the inductors included in the balun, the inductor shunt connected between the second inductor and the second node is preferably the fourth inductor alone.
(6) It is preferable that one of the first amplifier and the second amplifier be a carrier amplifier configured to mainly amplify the input signal, and that the other of the first amplifier and the second amplifier be a peak amplifier configured to amplify a peak of the input signal.
(7) It is preferable that the first amplifier be a carrier amplifier configured to mainly amplify the input signal and the second amplifier be a peak amplifier configured to amplify a peak of the input signal, and that the fourth node be disposed between the balun and the second amplifier.

DESCRIPTION OF THE PREFERRED EMBODIMENTS

Examples of an amplifier according to embodiments of the present disclosure will now be described with reference to the drawings. Note that the present disclosure is not limited to the examples described herein and is defined by the appended claims. All changes that fall within meanings and scopes equivalent to the claims are intended to be embraced by the present disclosure.

Figure 1:
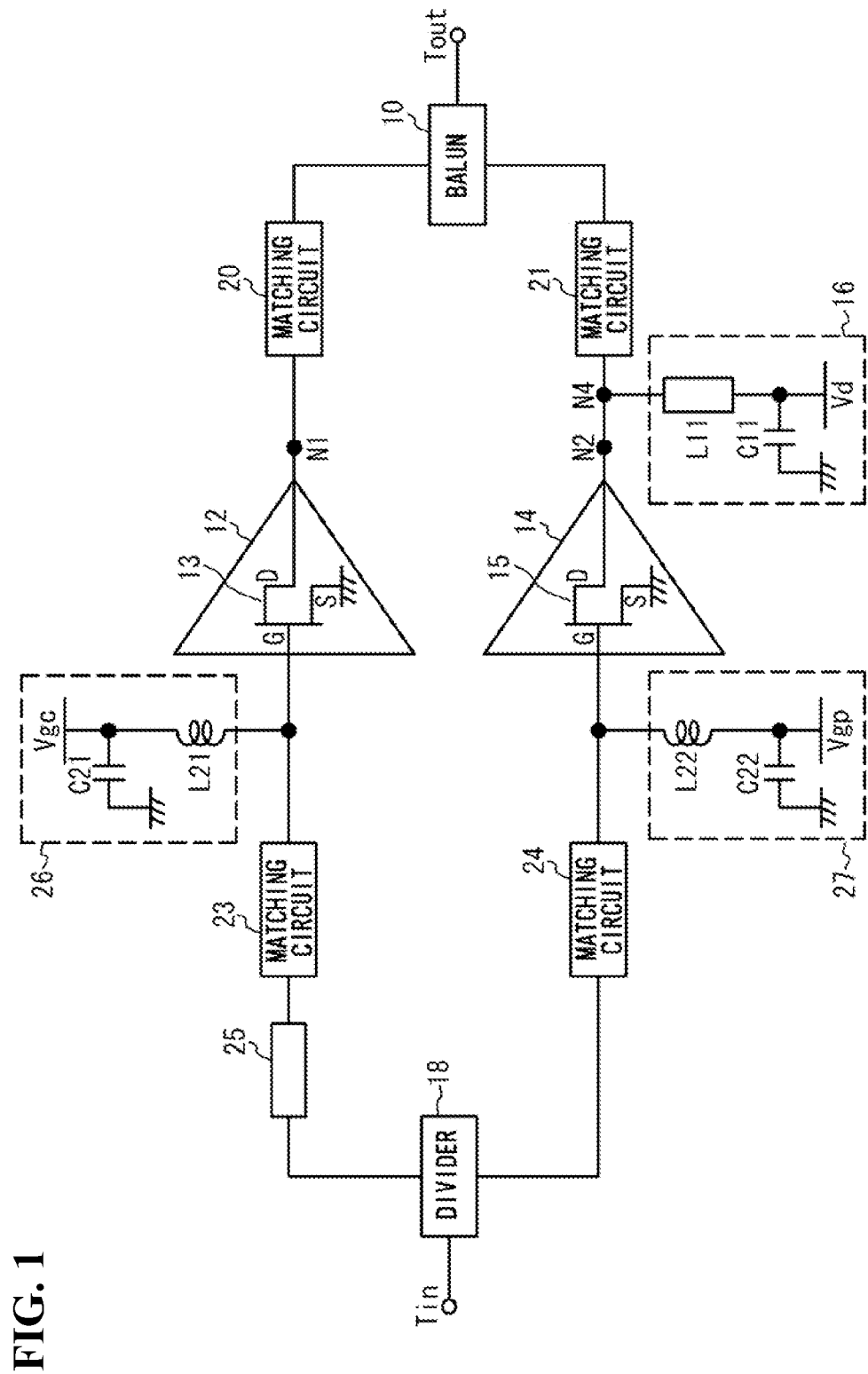
FIG. 1 is a block diagram of an amplifier according to Example 1.

FIG. 1 is a block diagram of an amplifier according to Example 1. As illustrated in FIG. 1, the amplifier includes a carrier amplifier 12 and a peak amplifier 14 connected in parallel between an input terminal Tin and an output terminal Tout. The input terminal Tin receives a radio frequency signal as an input signal. A divider 18 divides the input signal into two signals. One of the two signals passes through a phase shifter 25 and a matching circuit 23 and enters the carrier amplifier 12. The phase shifter 25 adjusts the phase between the carrier amplifier 12 and the peak amplifier 14. The matching circuit 23 matches the output impedance of the divider 18 to the input impedance of the carrier amplifier 12. The carrier amplifier 12 amplifies the received input signal and outputs the amplified signal to a node N1 (first node). The signal output to the node N1 passes through a matching circuit 20 and enters a balun 10. The matching circuit 20 matches the output impedance of the carrier amplifier 12 to the input impedance of the balun 10.

The other of the two signals from the divider 18 passes through a matching circuit 24 and enters a peak amplifier 14. The matching circuit 24 matches the output impedance of the divider 18 to the input impedance of the peak amplifier 14. The peak amplifier 14 amplifies the received input signal and outputs the amplified signal to a node N2 (second node). The signal output to the node N2 passes through a matching circuit 21 and enters the balun 10. The matching circuit 21 matches the output impedance of the peak amplifier 14 to the input impedance of the balun 10. The balun 10 combines two signals and outputs the resulting signal through a node N3 (third node) to the output terminal Tout. The Doherty amplifier in which the balun 10 serves as a combiner is called a Doherty amplifier of series connected load type.

The carrier amplifier 12 and the peak amplifier 14 are constituted, for example, by field effect transistors (FETs) 13 and 15, respectively, in which a source S is grounded, a gate G receives a radio frequency signal, and a drain D outputs a signal. The FETs 13 and 15 are, for example, GaN FETs or laterally diffused metal oxide semiconductor (LDMOS) transistors. The carrier amplifier 12 and the peak amplifier 14 may include multistage FETs 13 and 15, respectively. The divider 18 is, for example, a Wilkinson divider. A bias circuit 16 supplies a drain bias voltage Vd to the carrier amplifier 12 and the peak amplifier 14. Bias circuits 26 and 27 supply gate bias voltages Vgc and Vgp to the carrier amplifier 12 and the peak amplifier 14, respectively. The bias circuit 16 includes a quarter wavelength transmission line L11 connected to a node N4 and a shunt connected capacitor C11. The bias circuit 26 includes an inductor L21 connected to the input node of the carrier amplifier 12 and a shunt connected capacitor C21, and the bias circuit 27 includes an inductor L22 connected to the input node of the peak amplifier 14 and a shunt connected capacitor C22.

The carrier amplifier 12 operates as a class AB or class B amplifier, and the peak amplifier 14 operates as a class C amplifier. When input power is small, the carrier amplifier 12 mainly amplifies the input signal. When input power increases, the peak amplifier 14 as well as the carrier amplifier 12 amplifies the peak of the input signal. The carrier amplifier 12 and the peak amplifier 14 thus amplify the input signal. When input power is small and the peak amplifier 14 is off, an impedance when the balun 10 is viewed from the carrier amplifier 12 is twice a load R on the output terminal Tout (e.g., 2×50Ω). When input power is large and the peak amplifier 14 is on, an impedance when the balun 10 is viewed from the carrier amplifier 12 and an impedance when the balun 10 is viewed from the peak amplifier 14 are both equal to the load R (e.g., 50Ω). The matching circuits 20 and 23 are adjusted in such a way that when the peak amplifier 14 is off, the carrier amplifier 12 performs an optimum operation with a saturated output power at the load 2R, whereas when the peak amplifier 14 is on, the carrier amplifier 12 performs an optimum operation with a saturated output power at the load R. The matching circuits 21 and 24 are adjusted in such a way that when the peak amplifier 14 is off, an impedance when the peak amplifier 14 is viewed from the balun 10 is open, whereas when the peak amplifier 14 is on, the peak amplifier 14 performs an optimum operation with a saturated output power at the load R.

The balun 10 converts the load 2R, which is twice the load R, to the load R. The phase shifter 25 adjusts the phase of the input signal to be received by the carrier amplifier 12 in such a way that two input signals to be received by the balun 10 have opposite phases. To enable the carrier amplifier 12 and the peak amplifier 14 to operate as a class AB (or class B) amplifier and a class C amplifier, respectively, the gate bias voltages Vgc and Vgp, which are different, are supplied to the FETs 13 and 15, respectively. That is, the bias circuit 26 supplies the gate bias voltage Vgc to the gate G of the FET 13, and the bias circuit 27 supplies the gate bias voltage Vgp to the gate G of the FET 15. On the other hand, the same drain bias voltage Vd is supplied to the FETs 13 and 15. The drain bias voltage Vd can thus be supplied to the carrier amplifier 12 and the peak amplifier 14 by the single bias circuit 16.

Figure 2:
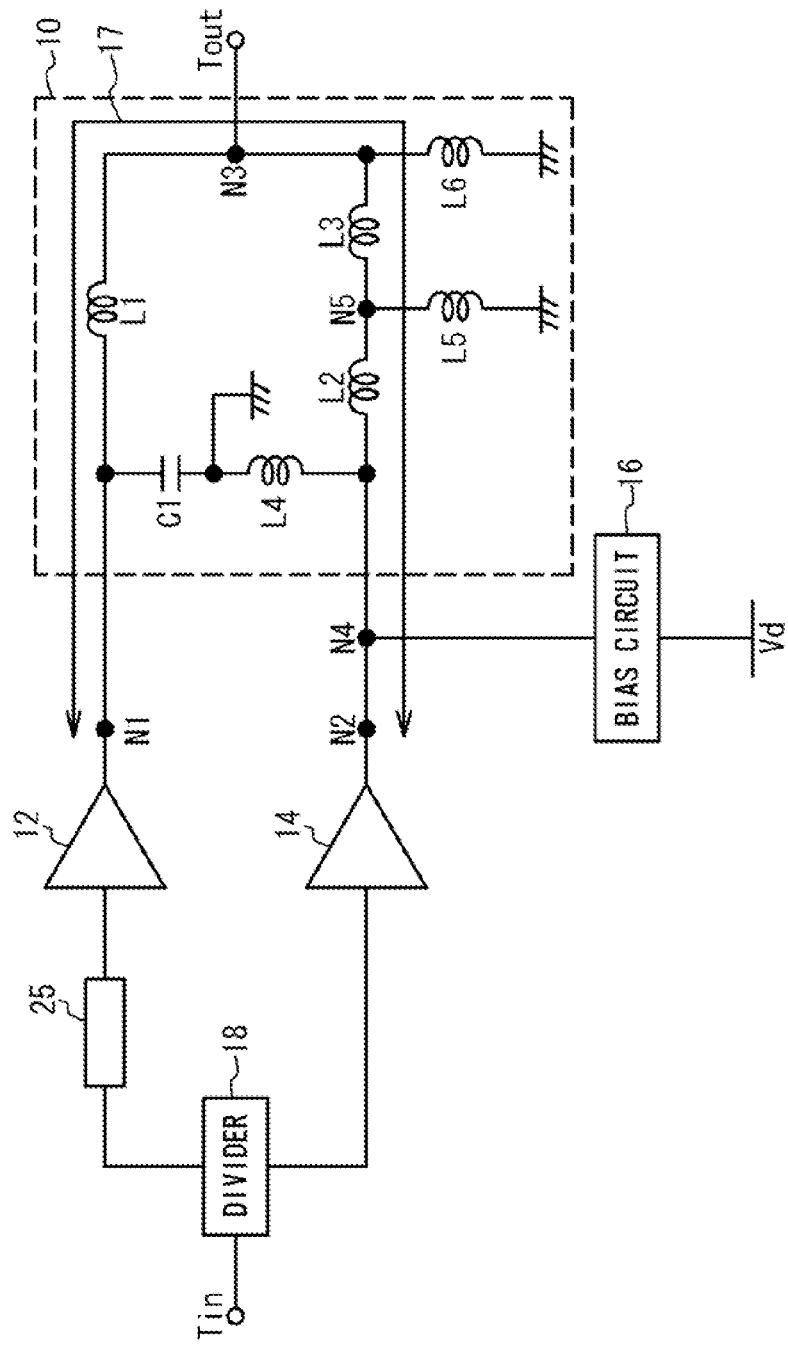
FIG. 2 is a circuit diagram of the amplifier according to Example 1.

FIG. 2 is a circuit diagram of the amplifier according to Example 1. Note that FIG. 2 does not show the matching circuits 20, 21, 23, and 24 and the bias circuits 26 and 27. As illustrated in FIG. 2, the balun 10 includes the capacitor C1 and the inductors L1 to L6 as lumped parameter elements. The inductor L1 (first inductor) is connected at one end thereof to the node N1 (first node) and connected at the other end thereof to the node N3 (third node). The capacitor C1 is shunt connected between the node N1 and the inductor L1. The inductor L2 (second inductor) is connected at one end thereof to the node N2 (second node) and connected at the other end thereof to the node N5 (fifth node). The inductor L3 (third inductor) is connected at one end thereof to the node N5 and connected at the other end thereof to the node N3. The inductor L4 (fourth inductor) is shunt connected between the node N2 and the inductor L2. The inductor L5 (fifth inductor) is shunt connected at the node N5. The inductor L6 (sixth inductor) is shunt connected between the inductor L3 and the node N3. The node N3 is connected to the output terminal Tout.

The inductors are connected in series in a path 17 that connects the nodes N1 and N2, with the node N3 therebetween, whereas no capacitor is connected in series in the path 17. This allows the nodes N1 and N2 to be DC-connected through the path 17. Thus, by connecting the bias circuit 16 to any node in the path 17, the drain bias voltage Vd can be supplied to both the carrier amplifier 12 and the peak amplifier 14. FIG. 2 illustrates an example where the node N4 is interposed between one end of the inductor L2 and the node N2.

Figure 3:
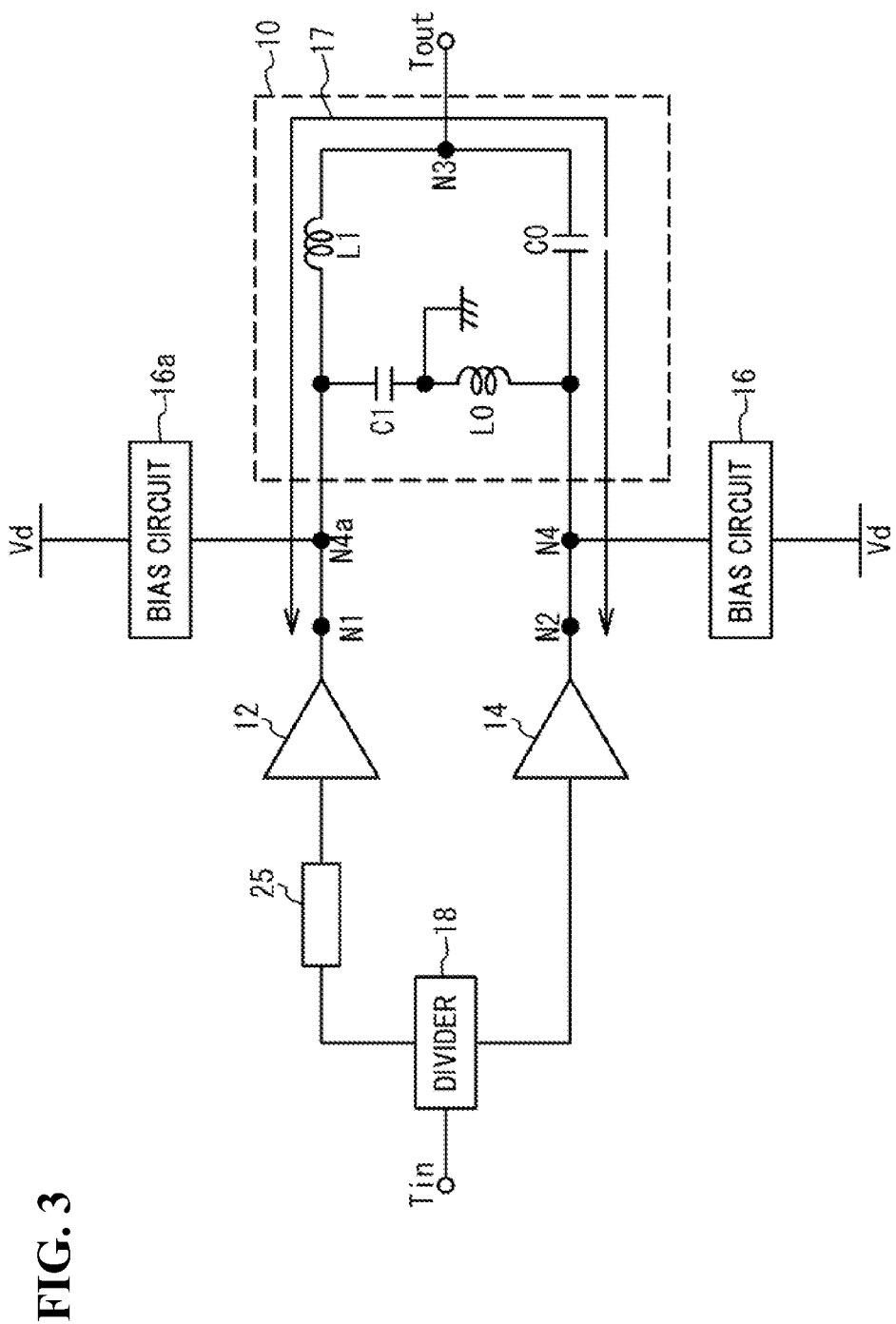
FIG. 3 is a circuit diagram of an amplifier according to Comparative Example 1.

FIG. 3 is a circuit diagram of an amplifier according to Comparative Example 1. As illustrated in FIG. 3, in the balun 10 according to Comparative Example 1, the inductor L1 is connected in series between the nodes N1 and N3, and the capacitor C1 is shunt connected between the node N1 and the inductor L1. A capacitor C0 is connected in series between the nodes N2 and N3, and an inductor L0 is shunt connected between the node N2 and the capacitor C0. A balun using typical lumped parameter elements includes the capacitor C0. The path 17 is thus DC-cut by the capacitor C0. This means that the bias circuit 16 cannot supply the drain bias voltage Vd to the carrier amplifier 12. Connecting a bias circuit 16a to a node N4a between the node N1 and the balun 10 allows the drain bias voltage Vd to be supplied to the carrier amplifier 12.

Comparative Example 1, where the path 17 is not DC-connected, requires the bias circuits 16 and 16a. This increases the size of the Doherty amplifier. Also, when the bias circuit 16a is connected near the node N1 of the carrier amplifier 12, the presence of a quarter wavelength transmission line and a capacitor in the bias circuit 16a may affect the impedance of, for example, the matching circuit 20 on the output side of the carrier amplifier 12 and degrade the performance of the carrier amplifier 12. The performance of the carrier amplifier 12, which is always in operation, most significantly affects the performance of the Doherty amplifier. In Comparative Example 1, therefore, the performance (e.g., efficiency) of the Doherty amplifier may easily be degraded.

Figure 4:
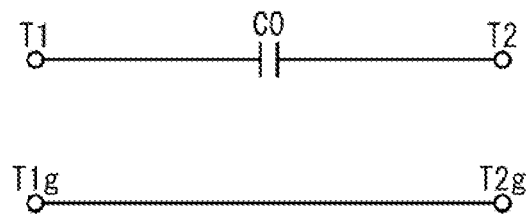
FIG. 4 is a diagram showing that a capacitor can be converted to an inductor.
Figure 5:
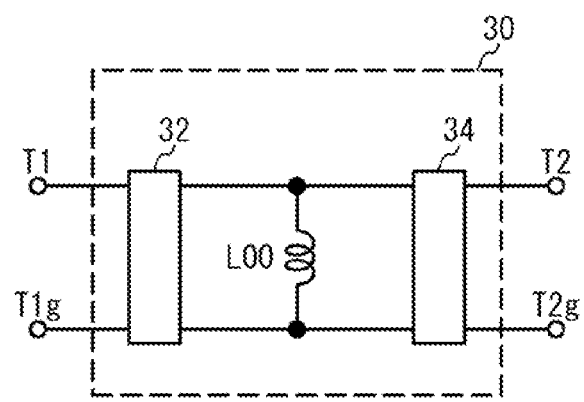
FIG. 5 is a diagram showing that a capacitor can be converted to an inductor.
Figure 6:
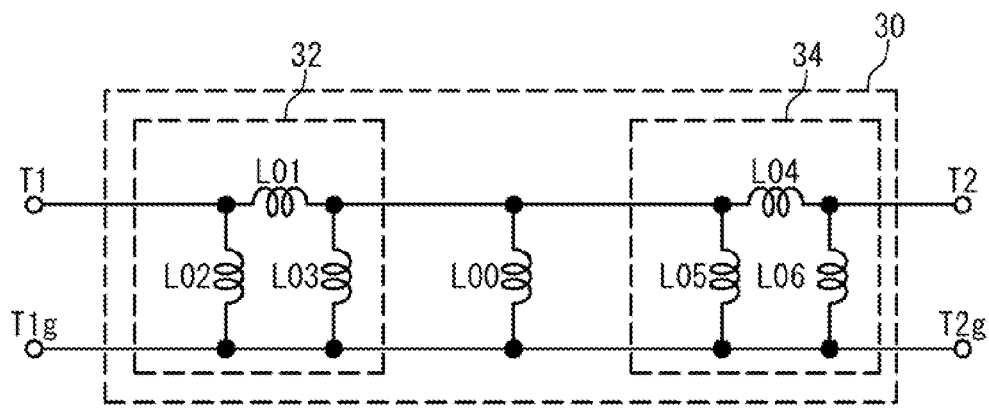
FIG. 6 is a diagram showing that a capacitor can be converted to an inductor.

FIGS. 4 to 6 are diagrams showing that a capacitor can be converted to an inductor. As illustrated in FIG. 4, the capacitor C0 is connected between terminals T1 and T2. Terminals T1g and T2g are ground terminals.

As illustrated in FIG. 5, the capacitor C0 is equivalent to a circuit 30 that includes a shunt connected inductor L00, a J-inverter 32 connected between the inductor L00 and the terminal T1, and a J-inverter 34 connected between the inductor L00 and the terminal T2.

As illustrated in FIG. 6, the J-inverter 32 is constituted by an inductor L01 connected in series and inductors L02 and L03 shunt connected at both ends of the inductor L01. The J-inverter 34 is constituted by an inductor L04 connected in series and inductors L05 and L06 shunt connected at both ends of the inductor L04.

Figure 7:
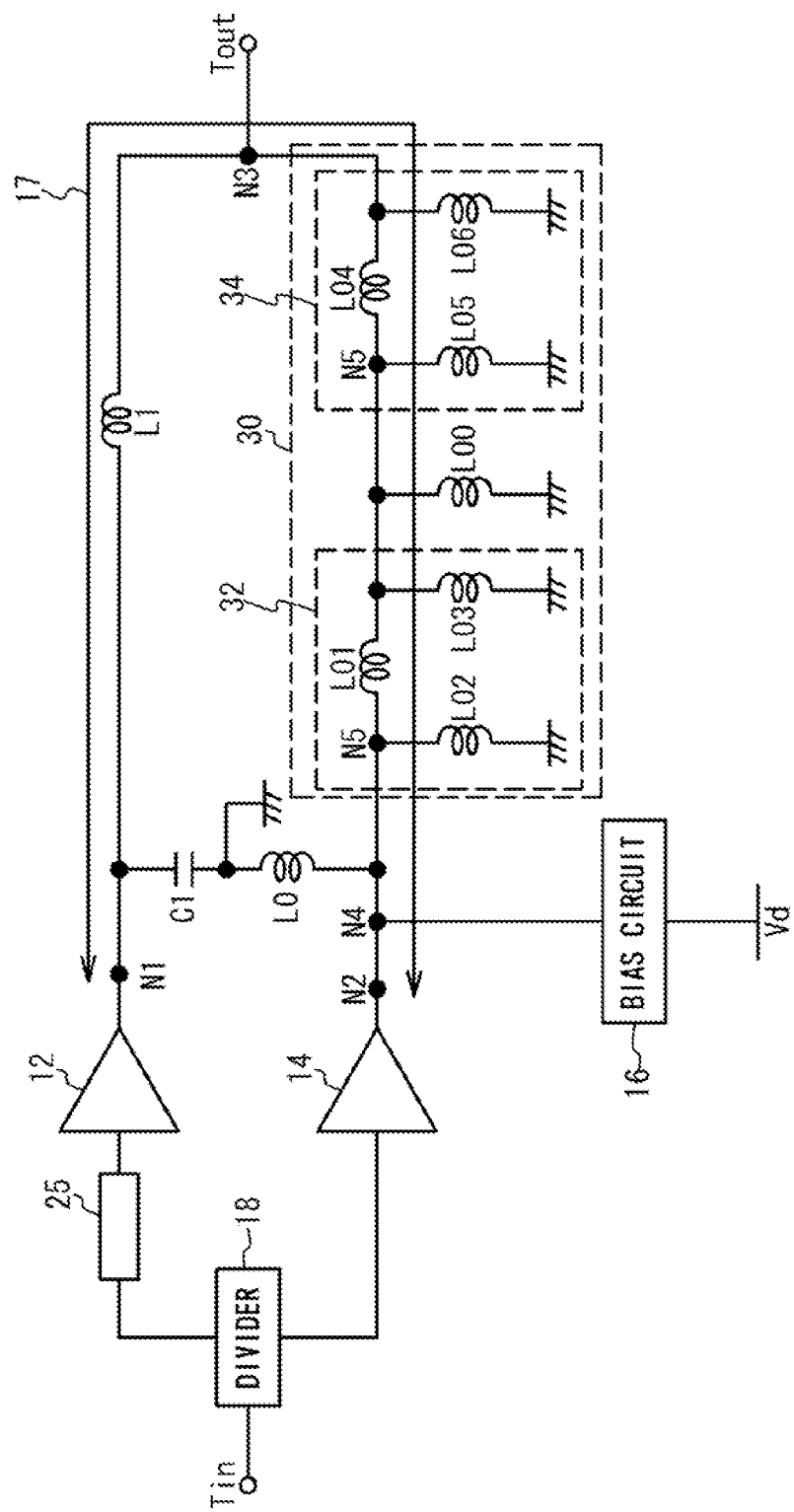
FIG. 7 is a circuit diagram of an amplifier according to Modification 1 of Example 1.

FIG. 7 is a circuit diagram of an amplifier according to Modification 1 of Example 1. As illustrated in FIG. 7, the amplifier includes the circuit 30 illustrated in FIG. 6, instead of the capacitor C0 of Comparative Example 1. The other configuration is the same as that of Example 1. The inductors L1, L01, and L04 are connected in series in the path 17. Thus, the path 17 is a DC-connected path. This allows the bias circuit 16 to supply the drain bias voltage Vd to the carrier amplifier 12.

One inductor L4 of Example 1 illustrated in FIG. 2 serves as the inductors L0 and L02 shunt connected in Modification 1 of Example 1 illustrated in FIG. 7. One inductor L5 of Example 1 illustrated in FIG. 2 serves as the inductors L03, L00, and L05 shunt connected in Modification 1 of Example 1 illustrated in FIG. 7. The inductor L6 in FIG. 2 serves as the inductor L06 in FIG. 7. The circuit configuration of Modification 1 of Example 1 illustrated in FIG. 7 can thus be implemented by the circuit configuration of Example 1 illustrated in FIG. 2.

Figure 8:
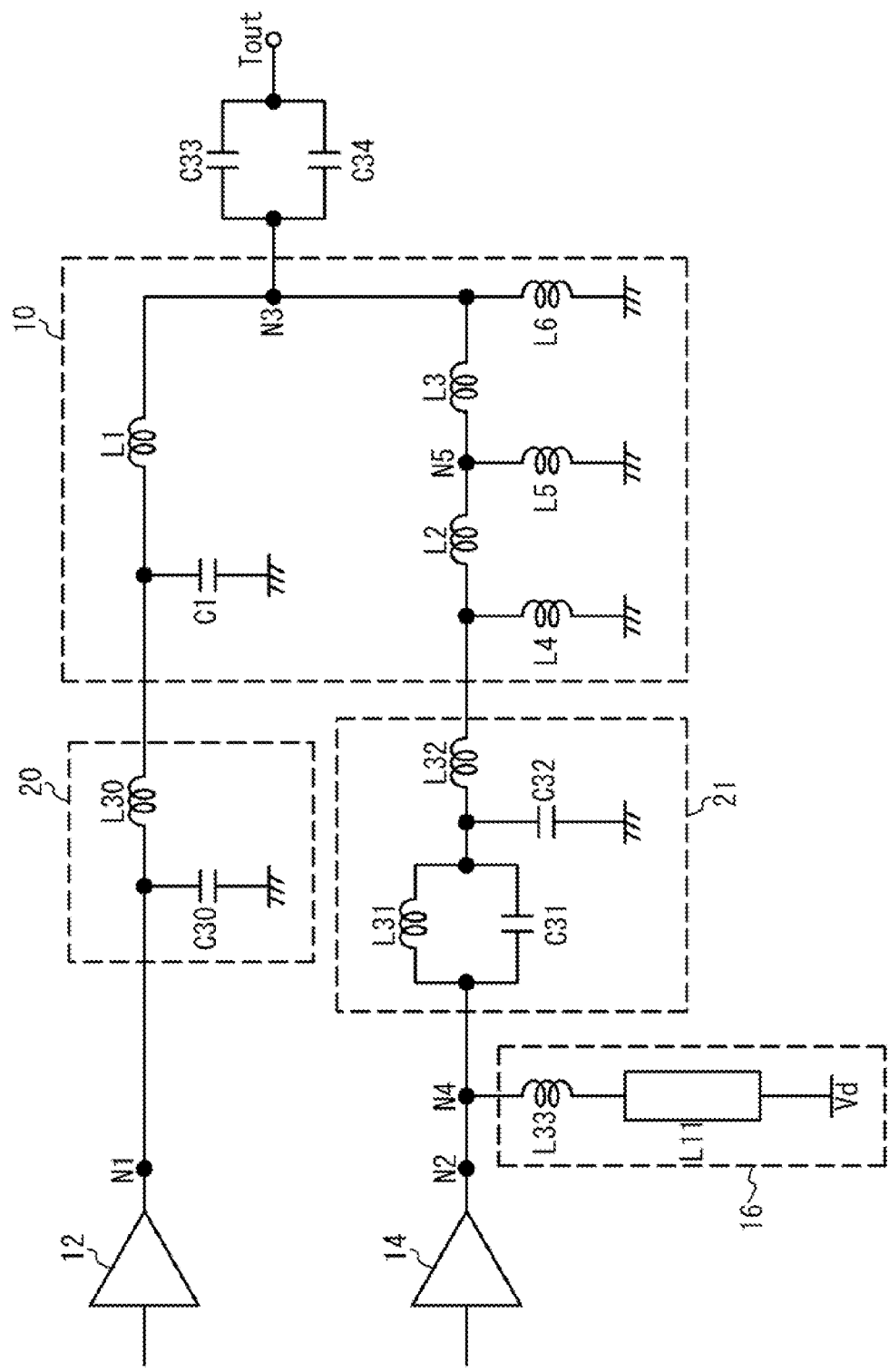
FIG. 8 is a circuit diagram of an output circuit according to Example 1.

FIG. 8 is a circuit diagram of an output circuit according to Example 1. Details of the matching circuits 20 and 21 are also illustrated in FIG. 8. As in FIG. 8, the matching circuit 20 is connected between the node N1 and the balun 10. The matching circuit 20 includes an inductor L30 and a capacitor C30. The matching circuit 21 is connected between the node N2 and the balun 10. The matching circuit 21 includes inductors L31 and L32 and capacitors C31 and C32. The bias circuit 16 is connected to the node N4. The bias circuit 16 includes an inductor L33 and the quarter wavelength transmission line L11. The bias circuit 16 may include the shunt connected capacitor C11 as illustrated in FIG. 1, or may include the inductor L33 connected in series as illustrated in FIG. 8. Capacitors C33 and C34 are connected in parallel between the node N3 and the output terminal Tout.

The capacitors C33 and C34 are DC cut capacitors. The circuit configuration of the balun 10 is the same as that illustrated in FIG. 2.

Figure 9:
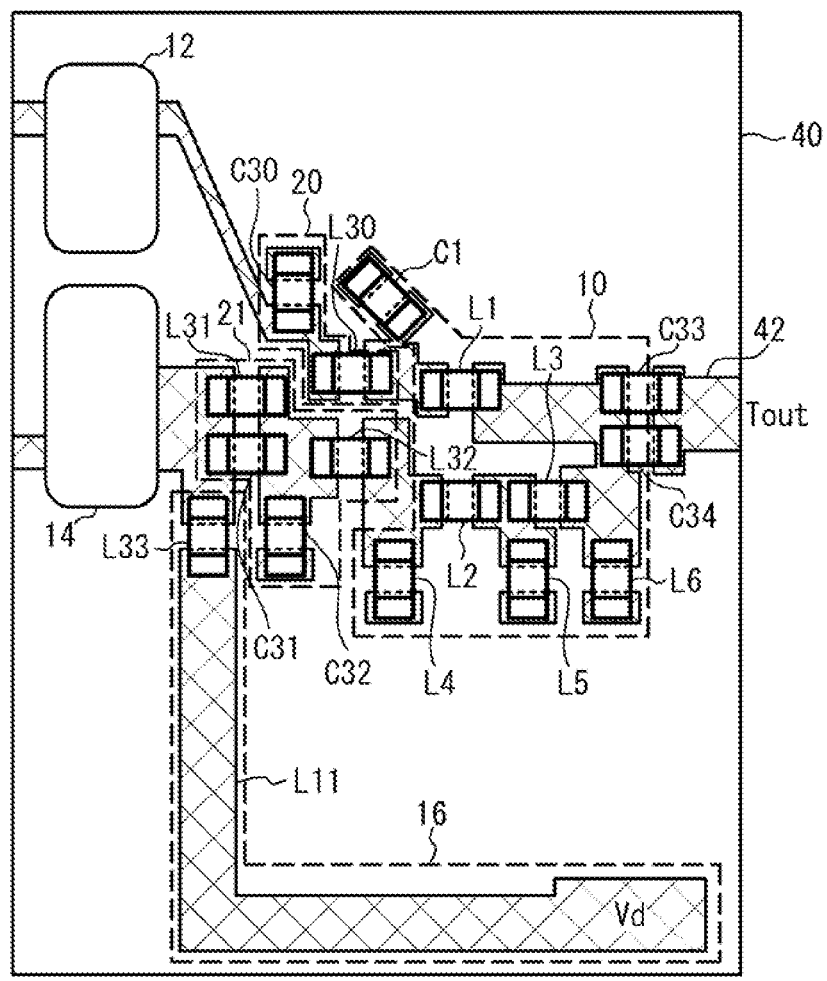
FIG. 9 is a plan view of the output circuit according to Example 1.

FIG. 9 is a plan view of the output circuit according to Example 1. As illustrated in FIG. 9, a conductive pattern 42 is disposed on a substrate 40. The substrate 40 is, for example, a resin or ceramic dielectric substrate of flame retardant type 4 (FR-4). The conductive pattern 42 is, for example, a metal layer of copper or gold. The carrier amplifier 12 and the peak amplifier 14 are mounted on the substrate 40. The substrate 40 is a dielectric substrate having a metal layer, which is supplied with a ground potential, on the undersurface thereof. The carrier amplifier 12 and the peak amplifier 14 are, for example, semiconductor chips mounted on a package. The substrate 40 has thereon the balun 10, the bias circuit 16, and the matching circuits 20 and 21. Chip components serving as the inductor L1 to L6 and L30 to L33 and the capacitors C1 and C30 to C34 are mounted on the substrate 40. The carrier amplifier 12, the peak amplifier 14, and the chip components are connected to one another by the conductive pattern 42. The quarter wavelength transmission line L11 is formed by the conductive pattern 42.

Figure 10:
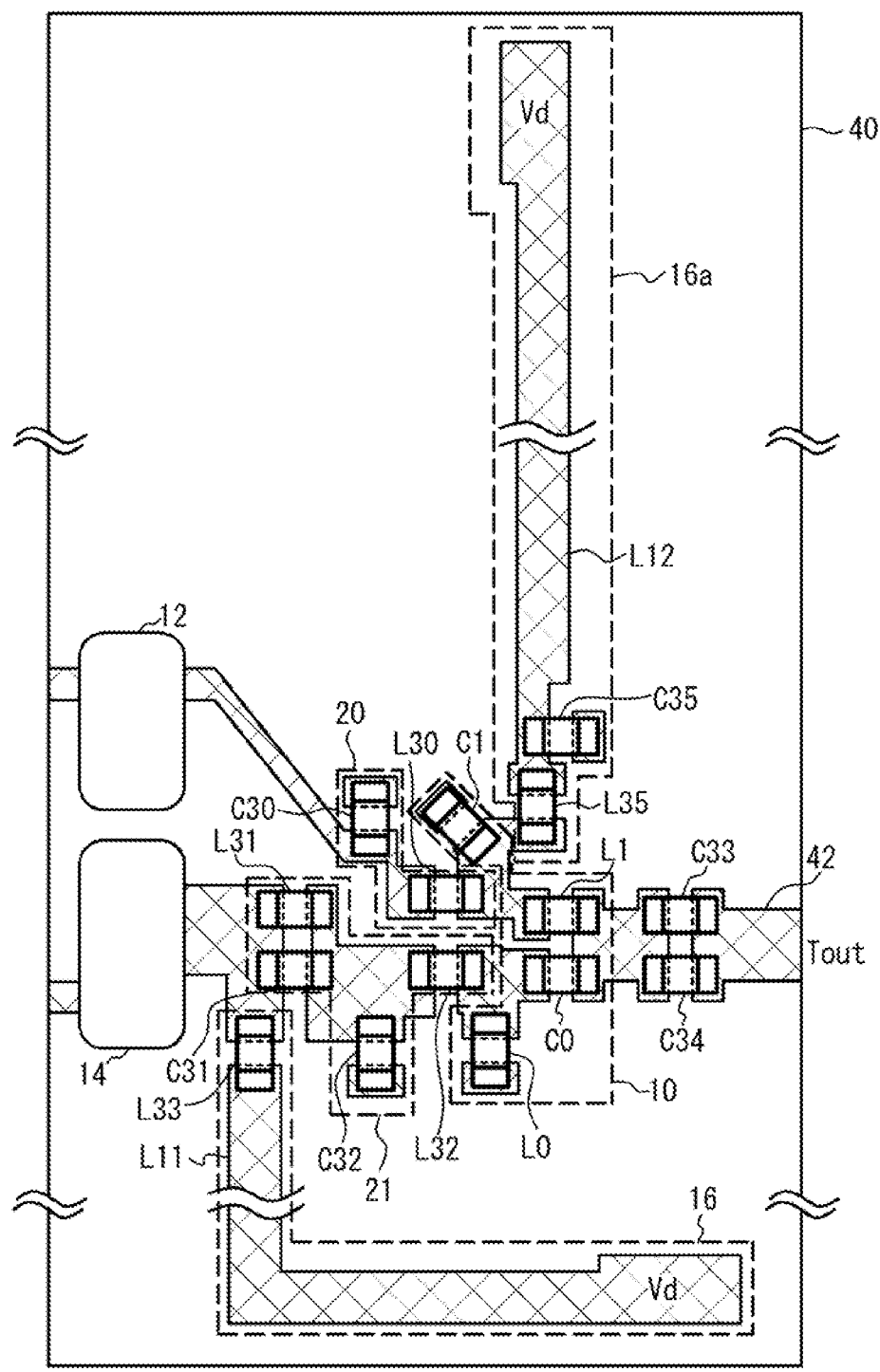
FIG. 10 is a plan view of an output circuit according to Comparative Example 1.

FIG. 10 is a plan view of an output circuit according to Comparative Example 1. As illustrated in FIG. 10, the matching circuits 20 and 21 and the bias circuit 16 are the same as those of Example 1 illustrated in FIG. 9. The balun 10 has the same circuit configuration as that in Comparative Example 1 illustrated in FIG. 3. The bias circuit 16a is disposed between the matching circuit 20 and the balun 10. The bias circuit 16a includes an inductor L35, a capacitor C35, and a quarter wavelength transmission line L12.

The balun 10 in Example 1 has a larger area than that in Comparative Example 1, because the balun 10 in Example 1 includes more chip components than that in Comparative Example 1. However, unlike Comparative Example 1 which requires the bias circuits 16 and 16a, Example 1 does not require the bias circuit 16a. The bias circuit 16a has a large area, because of the quarter wavelength transmission line L12 included therein. The area of the entire amplifier of Example 1 is thus smaller than that of Comparative Example 1.

Examples of the capacitance of each capacitor and the inductance or each inductor in Comparative Example 1 and Example 1 are as follows.

Example 1

C1: 0.1 pF, L1: 0.1 nH, L2: 0.4 nH, L3: 0.1 nH, L4: 32 nH, L5: 36 nH, L6: 92 nH

Comparative Example 1

C1: 0.6 pF, C0: 0.6 pH, L1: 3.3 nH, L0: 3.3 nH

Figure 11:
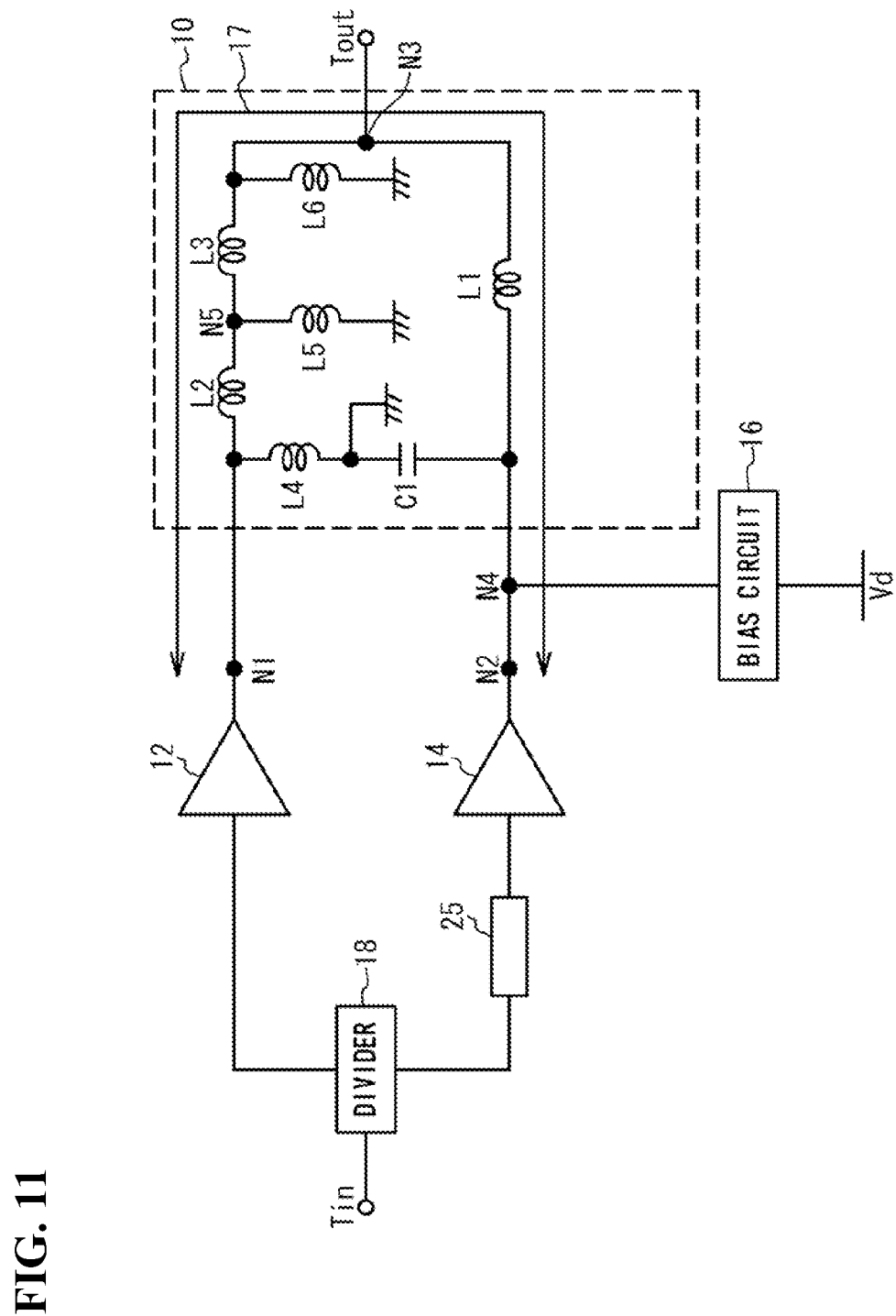
FIG. 11 is a circuit diagram of an amplifier according to Modification 2 of Example 1.

FIG. 11 is a circuit diagram of an amplifier according to Modification 2 of Example 1. As illustrated in FIG. 11, in the balun 10, the inductors L2 and L3 are connected in series and the inductors L4 to L6 are shunt connected between the nodes N1 and N3. The inductor L1 is connected in series and the capacitor C1 is shunt connected between the nodes N2 and N3. The phase shifter 25 is connected between the divider 18 and the peak amplifier 14. The other configuration is the same as that of Example 1 illustrated in FIG. 2 and the description thereof is omitted. Thus, as in Modification 2 of Example 1, the inductors L2 and L3 may be connected in series and the inductors L4 to L6 may be shunt connected between the nodes N1 and N3, and the inductor L1 may be connected in series and the capacitor C1 may be shunt connected between the nodes N2 and N3.

In Example 1 and its modifications, as illustrated in FIG. 2, the output node N1 (first node) of the carrier amplifier 12 (first amplifier) and the output node N2 (second node) of the peak amplifier 14 are DC-connected, with the node N3 (third node) in the balun 10, which includes lumped parameter elements, between the nodes N1 and N2. Thus, since no capacitor is connected in series in the path 17 between the carrier amplifier 12 and the peak amplifier 14, the bias circuit 16 can supply a bias voltage to the carrier amplifier 12.

The path 17 connecting the nodes N1 and N2, with the node N3 therebetween, has only one node N4 (fourth node) for supplying a bias voltage to the carrier amplifier 12 and the peak amplifier 14. Accordingly, since this configuration simply requires one bias circuit 16, a compact amplifier can be provided, as can be seen by the comparison between FIG. 9 and FIG. 10.

The node N4 is disposed between the balun 10 and the peak amplifier 14. This can suppress the effect of the bias circuit 16 on the output side of the carrier amplifier 12.

As illustrated in FIG. 2, the balun 10 includes the inductors L1 to L3 connected in series in the path 17 and the capacitor C1 shunt connected in the path 17. This prevents the path 17 from being DC-cut and makes it possible to form the balun 10.

As illustrated in FIG. 2, the balun 10 includes the capacitor C1 and the inductors L1 to L6. Thus, as described with reference to FIG. 4 to FIG. 6, the capacitor C0 connected in series in the path 17 in Comparative Example 1 can be replaced by the inductors L1 to L6. This prevents the capacitor C0 from being connected in series in the path 17 and allows the path 17 to be DC-connected.

The inductor L4 in Example 1 illustrated in FIG. 2 serves as the inductors L0 and L02 in Modification 1 of Example 1 illustrated in FIG. 7. That is, of the inductors included in the balun 10, the inductor shunt connected between the inductor L2 and the node N is the inductor L4 alone. The number of inductors can thus be reduced.

Although the carrier amplifier 12 and the peak amplifier 14 have been described as the first amplifier and the second amplifier, respectively, in the foregoing examples, the first amplifier and the second amplifier may be the peak amplifier 14 and the carrier amplifier 12, respectively. That is, it is necessary simply that one of the first amplifier and the second amplifier be a carrier amplifier and the other of the first amplifier and the second amplifier be a peak amplifier.

The embodiments disclosed herein should be considered illustrative, not restrictive, in all aspects. The scope of the present disclosure is defined by the appended claims, not by the meanings described above. All changes that fall within the meanings and scopes equivalent to the claims are intended to be embraced by the present disclosure.

What is claimed is:

1. A Doherty amplifier comprising:
   a divider configured to divide an input signal into two signals;
   a first amplifier configured to amplify one of the two signals and output an amplified signal to a first node;
   a second amplifier configured to amplify an other of the two signals and output an other amplified signal to a second node;
   a balun including lumped parameter elements and configured to output a signal obtained by combining the amplified signal output from the first amplifier with the other amplified signal output from the second amplifier to a third node, and the lumped parameter elements include:
   a first inductor connected at one end thereof to the first node and connected at an other end thereof to the third node,
   a capacitor shunt connected between the first node and the first inductor,
   a second inductor connected at one end thereof to the second node and connected at an other end thereof to a fifth node,
   a third inductor connected at one end thereof to the fifth node and connected at an other end thereof to the third node,
   a fourth inductor shunt connected between the second node and the second inductor,
   a fifth inductor shunt connected to the fifth node, and
   a sixth inductor shunt connected between the third inductor and the third node; and
   a path configured to DC-connect the first node to the second node, with the third node therebetween.

2. The Doherty amplifier according to claim 1, wherein the path has only one fourth node for supplying a bias voltage to the first amplifier and the second amplifier.

3. The Doherty amplifier according to claim 1, wherein the first inductor, the second inductor, and the third inductor are connected in series in the path, and
   the capacitor shunt is connected to the path.

4. The Doherty amplifier according to claim 2, wherein the first amplifier is a carrier amplifier configured to mainly amplify the input signal and the second amplifier is a peak amplifier configured to amplify a peak of the input signal; and
   the fourth node is disposed between the balun and the second amplifier.

5. The Doherty amplifier according to claim 1, wherein an inductor shunt connected between the second inductor and the second node is the fourth inductor shunt alone.

6. The Doherty amplifier according to claim 1, wherein one of the first amplifier and the second amplifier is a carrier amplifier configured to mainly amplify the input signal, and the other of the first amplifier and the second amplifier is a peak amplifier configured to amplify a peak of the input signal.

* * * * *